US009686457B2

(12) United States Patent
Madurawe et al.

(10) Patent No.: US 9,686,457 B2
(45) Date of Patent: Jun. 20, 2017

(54) HIGH EFFICIENCY IMAGE SENSOR PIXELS WITH DEEP TRENCH ISOLATION STRUCTURES AND EMBEDDED REFLECTORS

(71) Applicant: SEMICONDUCTOR COMPONENTS INDUSTRIES, LLC, Phoenix, AZ (US)

(72) Inventors: Raminda Madurawe, Sunnyvale, CA (US); William George Gazeley, Corvallis, OR (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/852,194

(22) Filed: Sep. 11, 2015

(65) Prior Publication Data
US 2017/0078539 A1    Mar. 16, 2017

(51) Int. Cl.
*H01L 27/00* (2006.01)
*H04N 5/225* (2006.01)
*H04N 5/33* (2006.01)
*H01L 27/146* (2006.01)

(52) U.S. Cl.
CPC ..... *H04N 5/2253* (2013.01); *H01L 27/14629* (2013.01); *H04N 5/2254* (2013.01); *H04N 5/33* (2013.01); *H01L 27/1463* (2013.01)

(58) Field of Classification Search
None
See application file for complete search history.

(56) References Cited

U.S. PATENT DOCUMENTS

| 8,071,455 | B2 * | 12/2011 | Cole | H01L 31/103 438/368 |
| 9,349,770 | B2 * | 5/2016 | Lenchenkov | H01L 27/14649 |
| 9,461,084 | B2 * | 10/2016 | Lee | H01L 27/1463 |
| 2005/0274988 | A1 * | 12/2005 | Hong | H01L 27/14625 257/225 |
| 2006/0267053 | A1 * | 11/2006 | Yang | H01L 27/14609 257/291 |
| 2007/0108476 | A1 | 5/2007 | Hong | |
| 2008/0061329 | A1 | 3/2008 | Park | |
| 2008/0128845 | A1 * | 6/2008 | Hwang | H01L 27/14625 257/432 |

(Continued)

*Primary Examiner* — Evren Seven
(74) *Attorney, Agent, or Firm* — Treyz Law Group, P.C.; Andrew C. Milhollin; Joseph F. Guihan

(57) ABSTRACT

An image sensor with an array of pixels is provided. To minimize optical and electrical and crosstalk, the array of pixels may include deep trench isolation structures interposed between adjacent pairs of photodiodes. In order to maximize quantum efficiency, the array of pixels may include a reflective stack formed under the photodiodes and the deep trench isolation structures. The deep trench isolation structures may be formed from doped glass, doped polysilicon, or metal having a doped oxide liner. The reflective stack may include multiple layers of materials having different indices of refraction. The reflective stack may include oxide, nitride, and semiconductor layers. The deep trench isolation structures may extend from the top of the photodiodes down to the reflective stack. The deep trench isolation structures may have a 50 to 1 aspect ratio.

16 Claims, 6 Drawing Sheets

(56) References Cited

U.S. PATENT DOCUMENTS

| | | | |
|---|---|---|---|
| 2010/0237451 A1* | 9/2010 | Murakoshi | H01L 27/1463 257/432 |
| 2011/0278436 A1* | 11/2011 | Rhodes | H01L 27/14609 250/208.1 |
| 2012/0007216 A1* | 1/2012 | Choy | H01L 23/49575 257/607 |
| 2012/0050554 A1 | 3/2012 | Levine | |
| 2013/0069130 A1* | 3/2013 | Kakehi | H01L 27/14623 257/292 |
| 2013/0200251 A1 | 8/2013 | Velichko | |
| 2013/0323875 A1* | 12/2013 | Park | H01L 31/02240 438/70 |
| 2014/0077323 A1* | 3/2014 | Velichko | H01L 27/14627 257/432 |
| 2015/0228689 A1 | 8/2015 | Lenchenkov | |
| 2015/0243694 A1* | 8/2015 | Ihara | H01L 27/14605 257/443 |
| 2015/0340445 A1* | 11/2015 | Choi | H01L 29/36 257/292 |
| 2015/0373255 A1* | 12/2015 | Kim | H01L 27/14607 348/349 |
| 2016/0035770 A1* | 2/2016 | Ahn | H01L 27/1463 257/432 |
| 2016/0043120 A1* | 2/2016 | Ahn | H01L 27/1463 257/229 |
| 2016/0043168 A1* | 2/2016 | Ding | H01L 29/0626 257/328 |
| 2016/0071896 A1* | 3/2016 | Kawabata | H01L 27/14627 348/294 |

\* cited by examiner

HIGH EFFICIENCY IMAGE SENSOR PIXELS WITH DEEP TRENCH ISOLATION STRUCTURES AND EMBEDDED REFLECTORS

BACKGROUND

This relates generally to image sensors, and more specifically high efficiency image sensor pixels with deep trench isolation structures and embedded reflectors.

Modern electronic devices such a cellular telephones, cameras, and computers often use digital image sensors. Imagers (i.e., image sensors) include a two-dimensional array of image sensing pixels. Each pixel includes a photosensor such as a photodiode that receives incident photons (light) and converts the photons into electrical charges. Conventional image pixel arrays include frontside illuminated image pixels or backside illuminated image pixels. Image pixels are fabricated on a semiconductor substrate using complementary metal-oxide-semiconductor (CMOS) technology or charge-coupled device (CCD) technology. The image sensors include photodiodes and other operational circuitry such as transistors formed in a front surface of the substrate. In a configuration that includes frontside illuminated image pixels, a dielectric stack is formed on the front surface of the substrate directly on top of the photodiodes. The dielectric stack includes metal routing lines and metal vias formed in dielectric material. Image light passes through the dielectric stack to the photodiodes. In a configuration that includes backside illuminated image pixels, a thin dielectric is formed on the back surface of the substrate directly on top of the photodiodes. The thin dielectric stack includes High-K dielectric materials and anti-reflective materials. Image light passes through the thin dielectric stack to the photodiodes.

However, in conventional frontside and backside illuminated image pixels, light that is not absorbed as it passes through the photodiode does not generate charge in the region of the photodiode and instead passes deeper into the substrate or is leaked into other pixels where the charge it generates may be undesirable. This undetected light can negatively affect the quantum efficiency and color accuracy of the pixel and can limit the performance of the device, particularly in low-light imaging operations. Infrared and near-infrared wavelengths of light are particularly susceptible to this phenomenon, as conventional photodiodes are less efficient at converting these wavelengths of light into electrical charge. Additionally, some of the light can be scattered or diffracted into neighboring pixels and/or photon-generated charge diffuse into neighboring pixels thus creating pixel crosstalk and further degrading pixel performance and image contrast. Isolation structures in traditional image pixels can only extend to a limited depth before compromising spatial accurate imaging (i.e., the width of isolation structures causes the isolation structures to have too large of a footprint, which reduces the maximum achievable pixel density).

It would therefore be desirable to simultaneously maximize quantum efficiency and minimize electrical and optical crosstalk between neighboring pixels in an array of image sensor pixels.

DETAILED DESCRIPTION

Embodiments of the present invention relate to image sensors, and more specifically to FSI image sensors with deep trench isolation between photodiodes and reflective structures below photodiodes to enhance charge collection and improve photodiode electrical and optical isolation. It will be recognized by one skilled in the art, that the present exemplary embodiments may be practiced without some or all of these specific details. In other instances, well-known operations have not been described in detail in order not to unnecessarily obscure the present embodiments.

Figure 1:
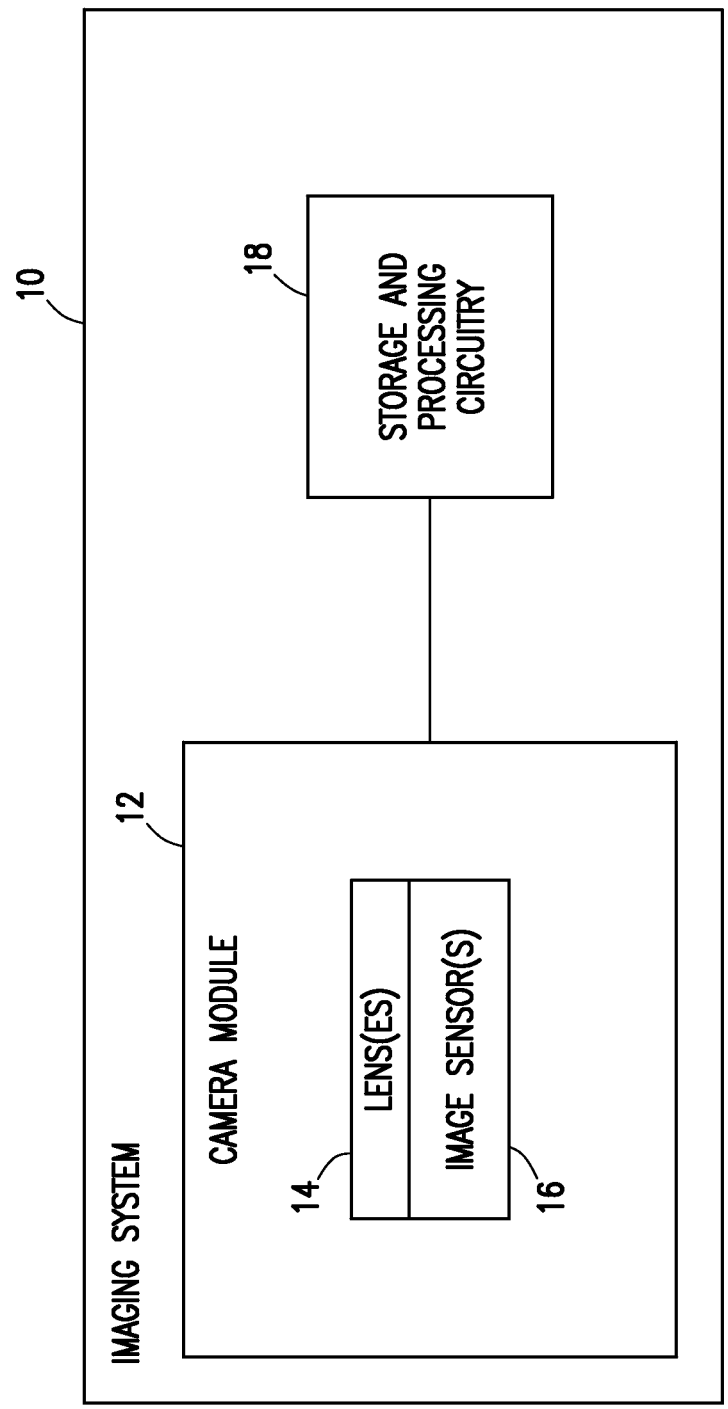
FIG. 1 is a diagram of an illustrative electronic device in accordance with an embodiment.

FIG. 1 is a diagram of an illustrative electronic device that uses an image sensor to capture images. Imaging system 10 of FIG. 1 may be a portable imaging system such as a camera, a cellular telephone, a video camera, or other imaging device that captures digital image data. Camera module 12 may be used to convert incoming light into digital image data. Camera module 12 may include a lens 14 and a corresponding image sensor 16. Lens 14 and image sensor 16 may be mounted in a common package and may provide image data to storage and processing circuitry 18. In some embodiments lens 14 may be part of an array of lenses and image sensor 16 may be part of an image sensor array.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensor 16 or an integrated circuit within module 12 that is associated with image sensor 16). Image data that has been captured and processed by camera module 12 may, if desired, be further processed and stored using storage and processing circuitry 18. Processed image data may, if desired, be provided to external equipment (e.g., a computer or other device) using wired and/or wireless communications paths coupled to storage and processing circuitry 18.

Image sensor 16 may be configured to receive light of a given color by providing the image sensor with a color filter. The color filters that are used for image sensor pixel arrays in the image sensor may, for example, be red filters, blue filters, and green filters. Each filter may form a color filter layer that covers the image sensor pixel array of the image sensor. Other filters such as white color filters, yellow color filters, dual-band IR cutoff filters (e.g., filters that allow visible light and a range of infrared light emitted by LED lights), etc. may also be used.

Figure 2:
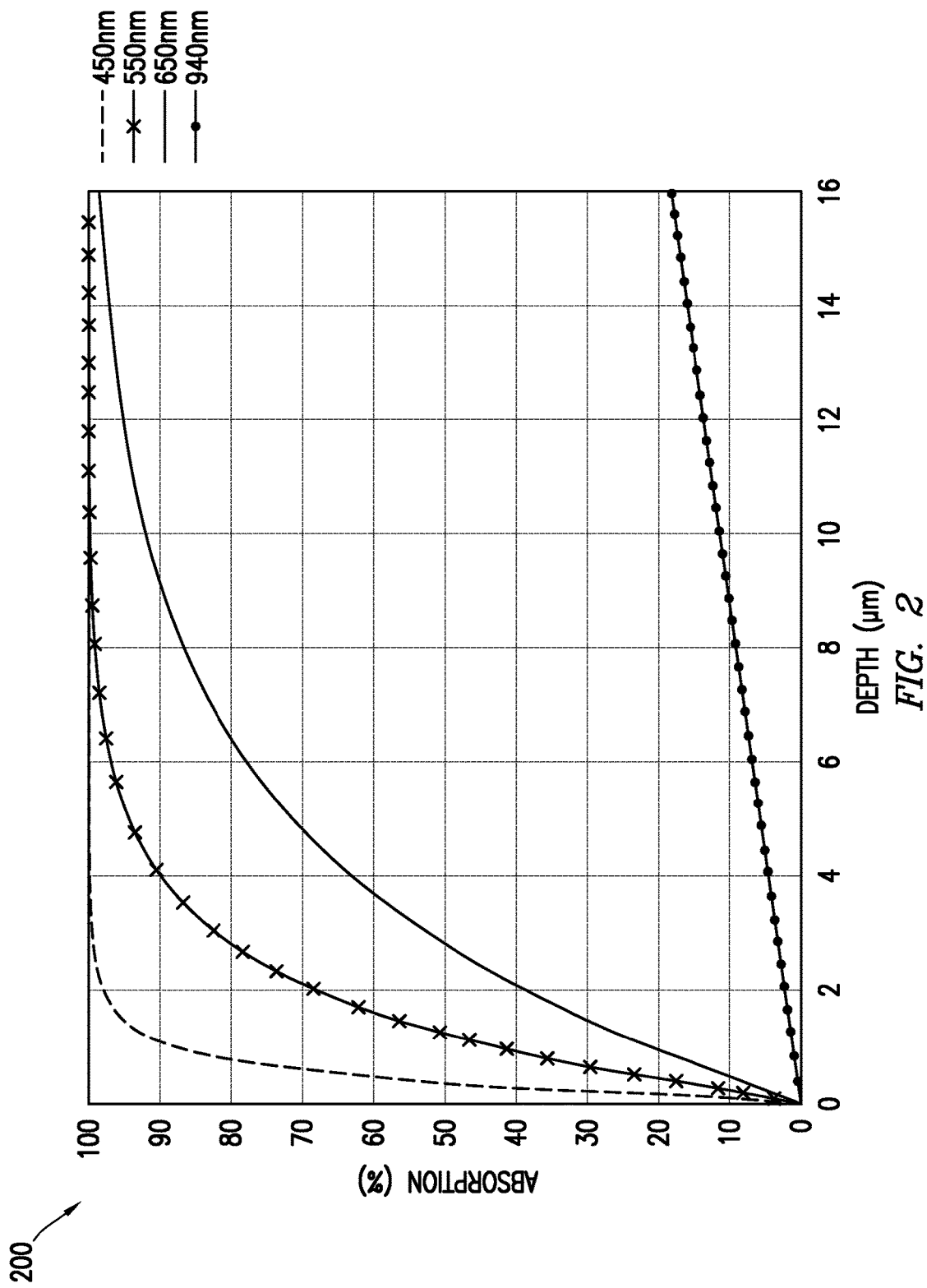
FIG. 2 is a diagram illustrating the percentage of light absorption of various wavelengths of light in a silicon substrate at different substrate depths.

An image sensor (e.g., image sensor 16 in FIG. 1) may include photodiodes formed in a silicon substrate. FIG. 2 is a diagram of illustrative absorption of various wavelengths of spectral light by a photodiode in a silicon substrate at various photodiode depths. As an example, for a photodiode depth of 4 microns, 5 percent of 940 nm light, 65 percent of 650 nm light, 90 percent of 550 nm light, and 100 percent of 450 nm light incident on the photodiode may be absorbed. The percentage of the incident light absorbed by a photodiode may also be referred to as the quantum efficiency of a photodiode. FIG. 2 illustrates the quantum efficiency of photodiodes without taking into consideration absorption losses caused by the microlenses and color filters. As a result, the quantum efficiencies of pixels using color filters and microlenses that are formed over photodiodes may have different quantum efficiencies for the wavelengths of light illustrated in FIG. 2.

As shown in FIG. 2, spectral light of lower wavelengths (e.g., 450 nm, 550 nm, and 650 nm) are nearly completely absorbed at a significantly lower substrate depth than higher wavelength spectral light (e.g., near-infrared light at 940 nm wavelength). Thus, it is necessary to increase either photodiode depth or effective photodiode depth in order to achieve higher absorption efficiency of light at near infrared and infrared wavelengths, and by doing so increase quantum efficiency.

Figure 3B:
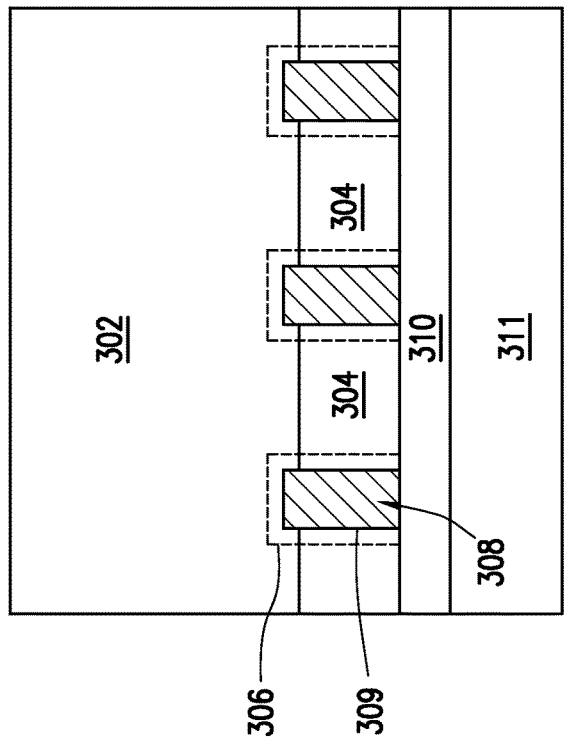
FIGS. 3A-3D are diagrams showing illustrative intermediate processing stages of an illustrative pixel array having deep trench isolation structures and a reflective stack in accordance with an embodiment.
Figure 3A:
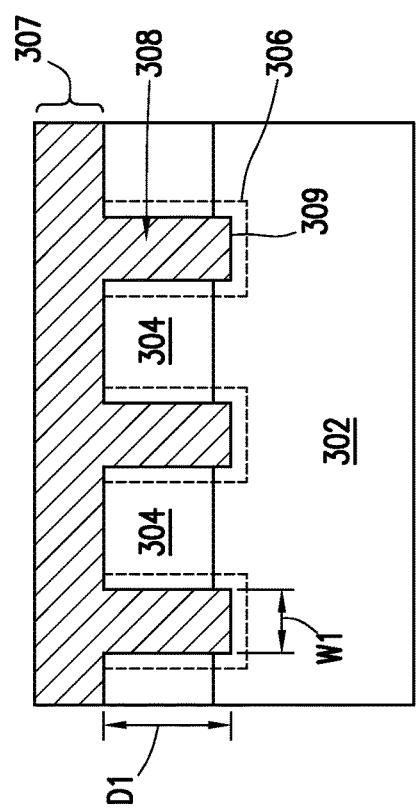

FIGS. 3A-3D are diagrams showing illustrative intermediate processing stages of an illustrative pixel array having deep trench isolation structures and a reflective stack in accordance with an embodiment. As shown in FIG. 3A, photodiodes 304 may be formed on a substrate 302. Photodiode 304 may be n-doped or p-doped. Substrate 302 may be p-doped or n-doped. Substrate 302 may include an epitaxial semiconductor material (e.g., single-crystal silicon, silicon carbide, gallium nitride, gallium arsenide, etc.) grown on substrate 302 (e.g., via molecular beam epitaxy). The epitaxial material may be n-doped or p-doped. In some embodiments, substrate 302 may be bulk n+ doped or p+ doped semiconductor material (e.g., silicon, silicon carbide, gallium nitride, gallium arsenide, etc.). In other embodiments, substrate 302 may have a silicon-on-insulator (SOI) arrangement in which an oxide layer may be interposed between a top layer of epitaxial silicon (from which photodiodes 304 may be formed) and a lower layer of bulk silicon. For illustrative purposes, an embodiment that includes an n-doped photodiode 304 constructed in a p-doped substrate is provided. It should be understood that a p-doped substrate 302 may have n-doped epitaxial silicon that can add to and increase the depth of n-type photodiode 304, where the depth of 304 is limited by traditional implantation doping techniques.

Trenches 309 may be formed between adjacent pairs of photodiode 304. Trenches 309 may penetrate into substrate 302. Trench 309 may be deeper than depth of photodiode 304. Trench 309 may be deeper than the depth of photodiode 304 and the thickness of an epitaxial layer deposited on substrate 302. Trenches 309 may have an aspect ratio (defined as trench depth over trench width) in the range of 10 to 1 or as high as 100 to 1. For example, a trench 309 having a 50 to 1 aspect ratio may have a width W1 of 0.5 micrometers and a depth D1 of 25 micrometers. Thus, high quality narrow and deep pixel-to-pixel isolation may be achieved with high aspect ratio trenches, which improves quantum efficiency. As an example, pixels having deep trench isolation structures having a depth of 25 micrometers and a width of 0.5 micrometers (which may allow for a photodiode depth of 25 micrometers) may achieve over 20% quantum efficiency for 940 nm near-infrared light, compared to the less than 10% quantum efficiency for 940 nm near-infrared light achievable by conventional pixels.

Deep trench isolation structures 308 may be deposited in trenches 309 between adjacent pairs of photodiodes 304. Still using n-doped photodiode 304 as an example, deep trench isolation structures 308 may be a p+ doped oxide (e.g., boron doped glass). In some embodiments, Deep trench isolation structures 308 may instead be a p+ doped polysilicon (e.g., boron doped polysilicon). In other embodiments, deep trench isolation structures 308 may be a p+ doped polysilicon (e.g., boron doped polysilicon) having a liner (e.g., a phosphorous doped oxide liner) interposed between the polysilicon and sidewalls and floors of trenches 309. In yet other embodiments, deep trench isolation structures 308 may be a refractory metal (e.g., tungsten, molybdenum or other metals having a resistance to high heat, corrosion and wear) having a p+ oxide liner (e.g., boron doped oxide). The use of boron doped glass or boron doped polysilicon allows trenches 309 to be filled conformally (i.e., the material in trenches 309 conforms to the contours of the walls of trenches 309). Furthermore, thermal drive-in (i.e., thermal diffusion) of the p+ dopant in the oxide, polysilicon, or liner may be performed to create passivation 306 in sections of photodiodes 304 and substrate 302 that form photodiode isolating sidewalls and floors of trenches 309. This passivation 306 is important to reduce dark-current that can originate at the etched semiconductor interface and may provide total internal reflection for photodiodes 304. In embodiments where a refractory metal is included in deep trench isolation structures 308, the metal provides a means of absorbance of infrared photons that may otherwise contribute to optical crosstalk. Furthermore, the refractory metal may be connected to voltage supply circuitry (not shown) to bias the refractory metal to a voltage in order to reduce dark current and improve photodiode operation. In embodiments where an oxide is included in deep trench isolation structures 308, optical crosstalk may be reduced due to photon reflection at oxide walls. The p-doping in the oxide, polysilicon, and liners in these exemplary embodiments may completely eliminate electrical crosstalk. One familiar in the art will recognize that a p-doped photodiode 304 may be constructed in an analogous manner.

After trenches 309 are filled, overflow portions 307 of deep trench isolation structures 308 that extend above the trench surfaces may then undergo chemical-mechanical polishing (CMP). As shown in FIG. 3B, after the CMP of portions 307, an oxide layer 310 may be deposited over the deep trench isolation structures and the photodiodes, a first carrier wafer 311 may be bonded on top of oxide layer 310, and the pixel array may be flipped upside down.

Figures 3C, 3D:
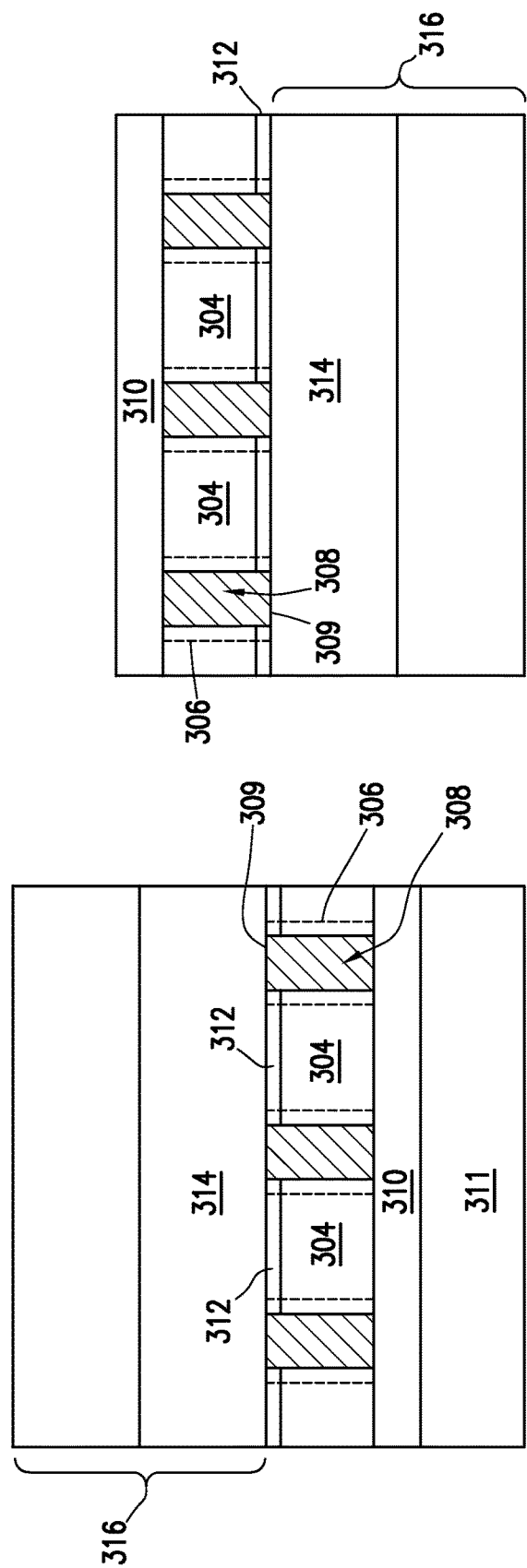

As shown in FIG. 3C, substrate 302 may be removed by chemical etching and/or CMP techniques, leaving a flat surface. Trench structure 308 may be used to control removal thickness of substrate 302. Subsequent to the removal of substrate 302, the flat surface may be treated to clean the surface, and a reflector stack 314 may be deposited on top of the flat surface. Reflector stack 314 may sometimes be referred to as reflective layer 314, which may include multiple layers having reflective properties and/or multiple interfaces between layers of materials having different indices of refraction. In embodiments in which substrate 302 is p+ doped semiconductor material, the removal of substrate 302 may be performed by chemical-mechanical polishing of the silicon close to the bottom of trench 309 to stop at the bottom trench surface 309, leaving multiple p+ doped regions 312 interposed between photodiodes 304 and reflector stack 314. The depth of region 312 is controlled by the depth difference between photodiode 304 and trench 309. Alternatively, in embodiments in which substrate 302 has a silicon-on-insulator arrangement, the removal of substrate 302 may be simplified by etching away the bulk silicon layer and then performing chemical-mechanical polishing on the oxide layer. Performing chemical-mechanical polishing in combination with semiconductor etching may provide more precise results when compared to embodiments in which substrate 302 is semiconductor material that is only chemically etched away (i.e., not polished). In arrangements where substrate 302 has an SOI arrangement, regions 312 may be doped with p+ material after etching and polishing has occurred. It should be noted that deep trench isolation structures 308 may extend to reflector stack 314 (i.e., there may be a direct interface between structures 308 and reflector stack 314). After the reflector stack is deposited, one or more layers to facilitate wafer bonding (not required for near-IR reflection) may be deposited above the reflector stack 314, and bonded to a second carrier wafer 316.

Reflector stack 314 may include multiple oxide, nitride, metal and semiconductor layers having different indices of refraction. For example, a first layer of reflector stack 314 may include a dry oxide, hafnium oxide, and tantalum oxide combination that has a fixed negative charge (for an n-type photodiode, and positive charge for a p-type photodiode) to improve pixel performance. In some embodiments, the first layer may include only one or two oxides of the group consisting of dry oxide, hafnium oxide, and tantalum oxide. A second layer of reflector stack 314 may be a semiconductor layer (e.g., a polysilicon layer). In some embodiments, the second layer may instead be a nitride layer. A third layer of reflector stack 314 may be an additional oxide layer. A fourth layer of reflector stack 314 may be an additional semiconductor layer (e.g., an additional polysilicon or silicon-nitride layer). In other embodiments, the reflector stack may be a single metal layer, or may include a metal layer and an oxide layer. It should be noted that reflector stack 314 may include any number of layers of any of the materials discussed above arranged in any order.

The layers in reflector stack 314 may be configured with particular indices of refraction in order to induce certain wavelengths or ranges of wavelengths of light to be reflected. For example, reflector stack 314 may be configured to only reflect a narrow band of infrared wavelengths or near-infrared wavelengths. In another example, reflector stack 314 may be configured to reflect a broad band of infrared wavelengths. In yet another example, reflector stack 314 may be configured to reflect both visible and infrared wavelengths.

As shown in FIG. 3D, first carrier wafer 311 may be etched/removed and the pixel array may be flipped right-side up. The pixel array in FIG. 3D may have a reflector stack 314 below photodiodes 304 and may undergo further processing. Additional processing may include removal of layer 310, gate oxide deposition, transistor formation, doping & annealing, and interconnects formation.

Figure 4:
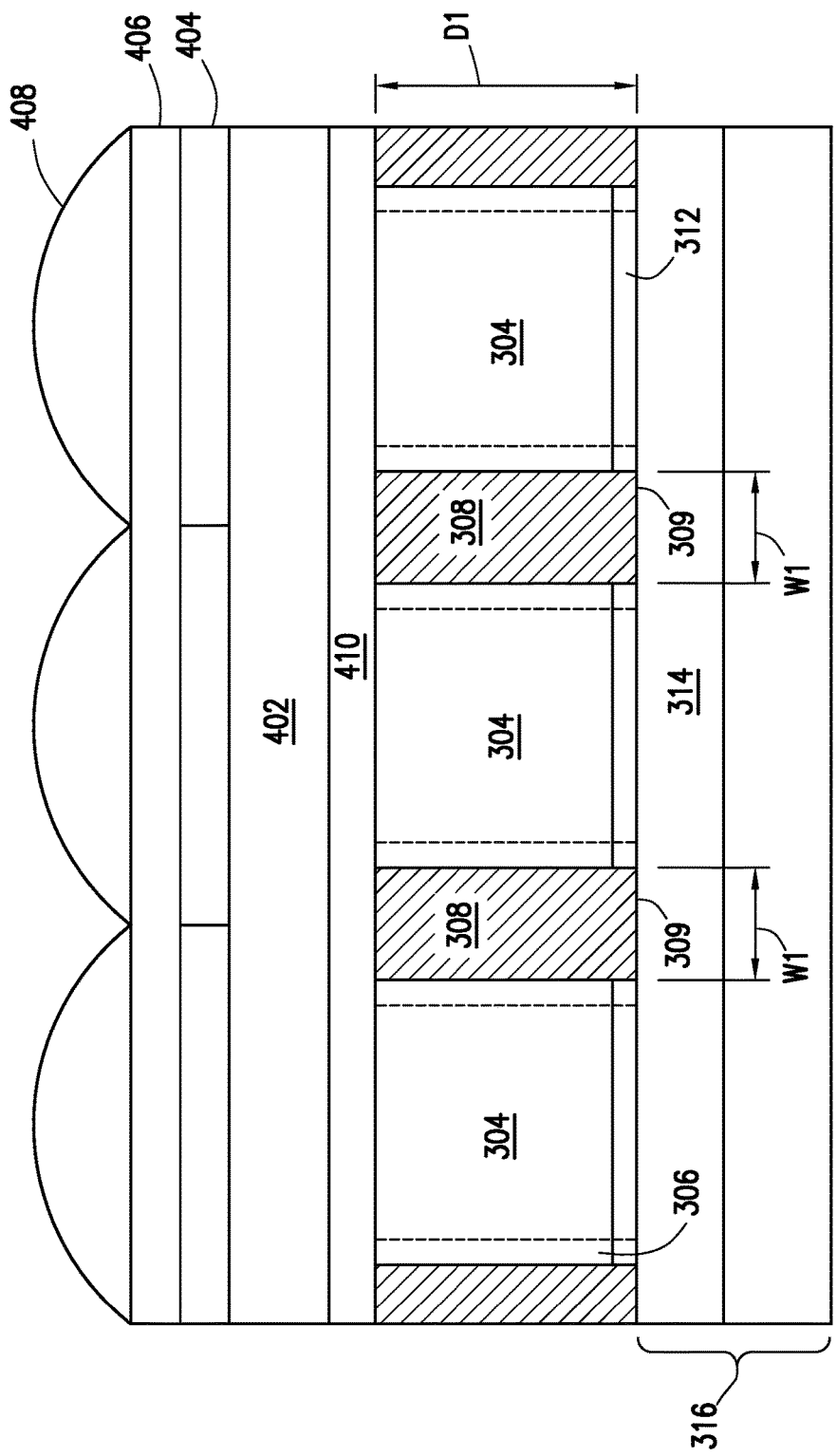
FIG. 4 is a cross-sectional side view of an illustrative image pixel array having deep trench isolation structures formed between adjacent pixels and a reflective stack in accordance with an embodiment.

FIG. 4 is a cross-sectional side view of an illustrative front side illuminated image pixel array formed in a substrate having deep trench isolation structures that may be formed between adjacent pixels and having a reflective stack that may be formed below the substrate in accordance with an embodiment. As shown in FIG. 4, a pixel array (e.g., the illustrative pixel array created in FIGS. 3A-3D) may undergo further processing to include a transistor stack 410, an interconnect stack 402, a color filter array 404, a passivation layer 406, and microlenses 408. Microlenses 408 may have an anti-reflection coating and may focus light onto respective photodiodes 304. Color filter array 404 may be optional in monochrome applications or may filter out non-infrared wavelengths of light in infrared dedicated applications. In embodiments including color filter array 404, passivation layer 406 may be interposed between color filter array 404 and microlenses 408. In embodiments in which color filter array 404 is omitted, passivation layer 406 may be interposed between interconnect stack 402 and microlenses 408. Light that enters photodiode 304 may pass through the entire depth D1 of photodiode 304 before being reflected by reflector stack 314. Upon reflection, the light may pass through the entire depth D1 of photodiode 304 a second time. Thus, the effective depth of each of photodiodes 304 is doubled compared to photodiodes without a reflective stack. This effective doubling of photodiode depth has a more significant impact on hard to absorb infrared and near-infrared wavelengths of light than on other wavelengths of light that may be fully absorbed at shallower photodiode depths (as shown in FIG. 2).

Figure 5:
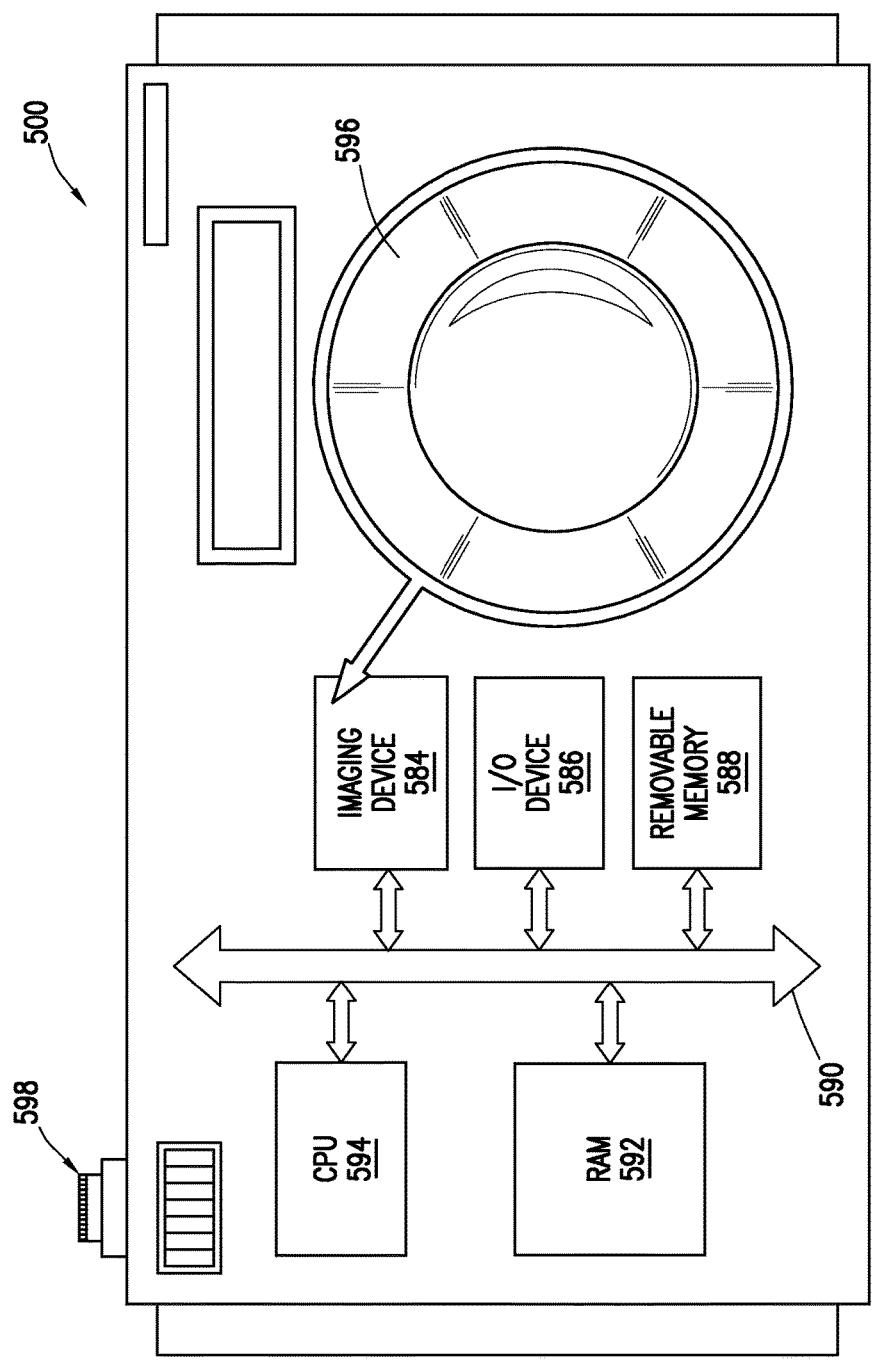
FIG. 5 is a block diagram of a processor system employing at least some of the embodiments of the image pixel array in FIGS. 3D and 4 in accordance with an embodiment.

FIG. 5 is a block diagram of a processor system employing at least some of the embodiments of the image pixel array in FIGS. 3D and 4. Device 584 may comprise the elements of device 10 (FIG. 1) or any relevant subset of the elements. Processor system 500 is exemplary of a system having digital circuits that could include imaging device 584. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

Processor system 500, which may be a digital still or video camera system, may include a lens or multiple lenses indicated by lens 596 for focusing an image onto an image sensor, image sensor array, or multiple image sensor arrays such as image sensor 16 (FIG. 1) when shutter release button 598 is pressed. Processor system 500 may include a central processing unit such as central processing unit (CPU) 594. CPU 594 may be a microprocessor that controls camera functions and one or more image flow functions and communicates with one or more input/output (I/O) devices 586 over a bus such as bus 590. Imaging device 584 may also communicate with CPU 594 over bus 590. System 500 may include random access memory (RAM) 592 and removable memory 588. Removable memory 588 may include flash memory that communicates with CPU 594 over bus 590. Imaging device 584 may be combined with CPU 594, with or without memory storage, on a single integrated circuit or on a different chip. Although bus 50 is illustrated as a single bus, it may be one or more buses or bridges or other communication paths used to interconnect the system components.

Various embodiments have been described illustrating image sensor having an array of image sensor pixels that includes deep trench isolation structures formed in trenches between adjacent photodiodes and that further includes a reflective stack formed below the photodiodes and the deep trench isolation structures.

An array of image sensor pixels may include first and second photosensitive elements formed in a semiconductor substrate, a deep isolation region formed between the first and second photosensitive elements, an oxide layer formed over the semiconductor substrate, and a reflective layer formed under the first photosensitive element, the second photosensitive element, and the deep trench isolation structure. The deep isolation region may be a deep trench isolation structure or a deep diffusion isolation structure. The array of image sensor pixels may include passivation layers formed between the deep trench isolation structure and the first and second photosensitive elements. The array of image sensor pixels may further include a first highly doped layer interposed between the reflective layer and the first photosensitive element and a second-highly doped layer interposed between the reflective layer and the second photosensitive element.

In an embodiment, the deep trench isolation structures may include a trench filled with p-type doped polysilicon. The deep trench isolation structures may include a p-type doped oxide liner. The p-type doped oxide liner may be interposed between the p-type doped polysilicon and the first photosensitive element and between the p-type doped polysilicon and the second photosensitive element. In another embodiment, the deep trench isolation structures may include a trench filled with n-type doped polysilicon. The deep trench isolation structures may include an n-type doped oxide liner. The n-type doped oxide liner may be interposed between the n-type doped polysilicon and the first photosensitive element and between the n-type doped polysilicon and the second photosensitive element. In another embodiment, the deep trench isolation structures may include a trench filled with metal. The deep trench isolation structures may include a p-type doped oxide liner. The p-type doped oxide liner may be interposed between the metal and the first photosensitive element and between the metal and the second photosensitive element. In yet another embodiment, the deep trench isolation structures may include a trench filled with p-type doped glass. In yet another embodiment, the deep trench isolation structures may include a trench filled with n-type doped glass. The polysilicon, the oxide liner, the glass, the first highly doped layer, and the second highly doped layer may each have a doping type that is the opposite of the doping type of the first and second photosensitive elements. The reflective layer may include a first oxide layer, a silicon layer formed under the first oxide layer, a nitride layer formed under the first oxide layer, a second oxide layer formed under the nitride layer, and a silicon layer formed under the nitride layer. The first oxide layer may include an oxide selected from the group consisting of dry oxide, hafnium oxide, and tantalum oxide. In another embodiment, the reflective layer may include a reflector stack that reflects infrared light.

The array of image sensor pixels may also include an oxide layer formed over the photodiodes and the isolation structures, an interconnect layer formed over the oxide layer, a color filter array formed over the interconnect layer, a passivation layer formed over the color filter array, microlenses formed over the passivation layer, and p-doped material interposed between each photodiode and respectively adjacent isolation structures. The reflective layer may reflect infrared light. Each of the isolation structures may have a width and depth and the ratio of the depth to the width may be between 10 to 1 and 100 to 1.

The foregoing is merely illustrative of the principles of this invention and various modifications can be made by those skilled in the art without departing from the scope and spirit of the invention. The foregoing embodiments may be implemented individually or in any combination.

What is claimed is:

1. An array of front side illuminated image sensor pixels, comprising:
    first and second photosensitive elements formed in a semiconductor substrate of the front side illuminated image sensor pixels;
    a deep isolation region formed between the first and second photosensitive elements; and
    a reflective layer formed under the first photosensitive element, the second photosensitive element, and the deep isolation region, wherein the reflective layer comprises:
        a first oxide layer;
        a first silicon layer formed under the first oxide layer;
        a nitride layer formed under the first oxide layer;
        a second oxide layer formed under the nitride layer; and
        a second silicon layer formed under the nitride layer.

2. The array of front side illuminated image sensor pixels defined in claim 1 wherein the deep isolation region comprises a deep trench isolation structure, the array of front side illuminated image sensor pixels further comprising:
    passivation layers formed between the deep isolation region and the first and second photosensitive elements; and
    an oxide layer formed over the semiconductor substrate.

3. The array of front side illuminated image sensor pixels defined in claim 2, further comprising:
    a first p+ doped layer interposed between the reflective layer and the first photosensitive element;
    a second p+ doped layer interposed between the reflective layer and the second photosensitive element.

4. The array of front side illuminated image sensor pixels defined in claim 3, wherein the deep trench isolation structure comprises:
    a trench filled with doped polysilicon.

5. The array of front side illuminated image sensor pixels defined in claim 4, wherein the deep trench isolation structure further comprises:
    a doped oxide liner, wherein the doped oxide liner is interposed between the doped polysilicon and the first photosensitive element and between the doped polysilicon and the second photosensitive element.

6. The array of front side illuminated image sensor pixels defined in claim 2, wherein the deep trench isolation structure comprises:
    a trench filled with metal; and
    a doped oxide liner interposed between the metal and the first photosensitive element and between the metal and the second photosensitive element, wherein the metal receives a bias voltage.

7. The array of front side illuminated image sensor pixels defined in claim 2, wherein the deep trench isolation structure comprises:
    a trench filled with doped glass.

8. The array of front side illuminated image sensor pixels defined in claim 1, wherein the deep isolation region comprises:
    a deep diffusion isolation structure.

9. An image sensor having an array of pixels, comprising:
    photodiodes formed in a semiconductor substrate;
    deep trench isolation structures formed between adjacent pairs of the photodiodes; and
    a reflective layer formed under the photodiodes and the deep trench isolation structures, wherein the reflective layer comprises:
        a first oxide layer;
        a first silicon layer formed under the first oxide layer;
        a nitride layer formed under the first oxide layer;
        a second oxide layer formed under the nitride layer; and
        a second silicon layer formed under the nitride layer.

10. The image sensor defined in claim 9, wherein the first oxide layer comprises an oxide selected from the group consisting of: dry oxide, hafnium oxide, and tantalum oxide.

11. An imager, comprising:
an array of front side illuminated pixels arranged in rows and columns, wherein the array of front side illuminated pixels comprises:
photodiodes formed in a substrate;
isolation structures formed between adjacent pairs of the photodiodes; and
a reflective stack formed under the isolation structures and the photodiodes, wherein the reflective stack comprises:
a first oxide layer;
a first silicon layer formed under the first oxide layer;
a nitride layer formed under the first oxide layer;
a second oxide layer formed under the nitride layer; and
a second silicon layer formed under the nitride layer.

12. The imager defined in claim 11, the array of front side illuminated pixels further comprising:
an oxide layer formed over the photodiodes and the isolation structures; and
an interconnect layer formed over the oxide layer.

13. The imager defined in claim 12, the array of front side illuminated pixels further comprising:
a color filter array formed over the interconnect layer; and
a passivation layer formed over the color filter array.

14. The imager defined in claim 13, the array of front side illuminated pixels further comprising:
microlenses formed over the passivation layer; and
doped material interposed between each photodiode and respectively adjacent isolation structures.

15. The imager defined in claim 11, wherein the reflective stack reflects infrared light.

16. The imager defined in claim 11, wherein each of the isolation structures has a width and a depth and the ratio of the depth to the width is between 25 to 1 and 50 to 1.

* * * * *